United States Patent
Xie et al.

(10) Patent No.: US 6,303,941 B1
(45) Date of Patent: Oct. 16, 2001

(54) INTEGRATED ASYMMETRIC RESONANT TUNNELING DIODE PAIR CIRCUIT

(75) Inventors: Yi-Ming Xie, San Francisco; Joel N. Schulman, Malibu; David H. Chow, Newbury Park, all of CA (US)

(73) Assignee: HRL Laboratories, Malibu, CA (US)

( * ) Notice: Subject to any disclaimer, the term of this patent is extended or adjusted under 35 U.S.C. 154(b) by 0 days.

(21) Appl. No.: 09/427,196

(22) Filed: Oct. 25, 1999

(51) Int. Cl.[7] ................................................. H01L 29/06
(52) U.S. Cl. ............................ 257/25; 257/21; 257/22; 257/184
(58) Field of Search ................................. 257/14, 21, 22, 257/23, 25, 184

(56) References Cited

U.S. PATENT DOCUMENTS 4,902,912 * 2/1990 Capasso et al. ........................ 257/25
5,939,729 * 8/1999 Chu et al. ............................... 257/25

* cited by examiner

Primary Examiner—Minh Loan Tran
(74) Attorney, Agent, or Firm—Tope-McKay & Associates

(57) ABSTRACT

Presented is an integrated asymmetric resonant tunneling diode pair circuit exhibiting current-voltage characteristics providing multistable states which may be tailored for multistable solutions. Also presented are apparatus incorporating the invention therein, for which the invention provides a simple, integrated design that greatly reduces circuit complexity and size. The present invention is useful in all applications utilizing multiple peak characteristics of the current-voltage curve, such as multiple-valued logic analog-to-digital quantizers, frequency multiplication devices, waveform scrambling devices, memory operations, and parity-bit generation, among others.

20 Claims, 5 Drawing Sheets

| Layer | Preferred Material | Preferred Thickness Range (Å) | Preferred Thickness (Å) | Preferred Doping Level Range (/cm³) | Preferred Doping Level (/cm³) |
|---|---|---|---|---|---|
| Substrate | InP | N/A | N/A | Optional ~ $5 \times 10^{16}$ | Optional $5 \times 10^{16}$ |
| 1 | InGaAs | $1 \times 10^3$ to $1 \times 10^4$ | $4 \times 10^3$ | $1 \times 10^{18}$ to $1 \times 10^{19}$ | $1 \times 10^{19}$ |
| 2 | InGaAs | 100 to 500 | 250 | $3 \times 10^{17}$ to $1 \times 10^{18}$ | $5 \times 10^{17}$ |
| 3 | AlAs | 10 to 30 | 20 | Undoped | Undoped |
| 4 | InGaAs | 10 to 40 | 20 | Undoped | Undoped |
| 5 | InAs | 10 to 25 | 12 | Undoped | Undoped |
| 6 | InGaAs | 10 to 40 | 20 | Undoped | Undoped |
| 7 | AlAs | 10 to 30 | 20 | Undoped | Undoped |
| 8 | InGaAs | 100 to 500 | 250 | $5 \times 10^{15}$ to $2 \times 10^{17}$ | $1 \times 10^{17}$ |
| 9 | InGaAs | 300 to $3 \times 10^3$ | $1 \times 10^3$ | $1 \times 10^{18}$ to $1 \times 10^{19}$ | $1 \times 10^{19}$ |

FIG. 2

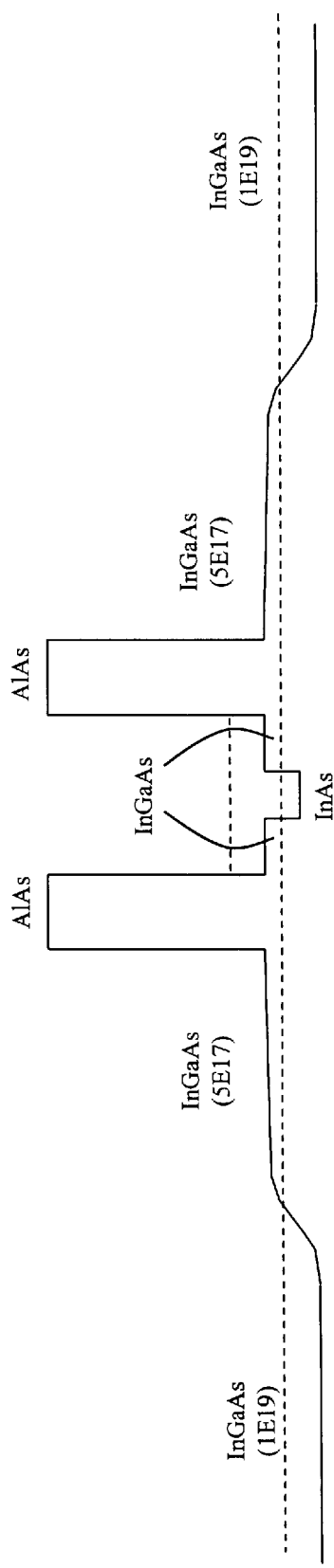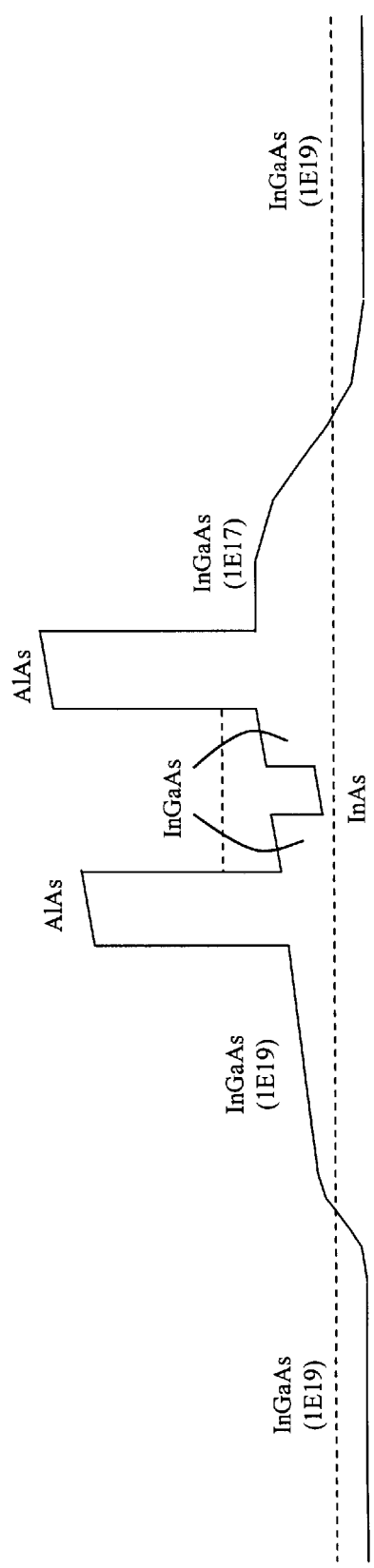

INTEGRATED ASYMMETRIC RESONANT TUNNELING DIODE PAIR CIRCUIT

TECHNICAL FIELD

The present invention is concerned with apparatus including semiconductor devices whose operation is based on resonant tunneling through a quantum well. In particular, this invention relates to an integrated resonant tunneling diode pair and devices utilizing resonant tunneling diode circuits with multistable states in which the current-voltage characteristic is asymmetric.

BACKGROUND OF THE INVENTION

A diode is a semiconductor device having a non-linear voltage-current relation. Diodes are important solid-state devices and have many electronic applications. The tunnel diode is a variety of diode with the unusual characteristic of negative differential resistance. Negative differential resistance is a voltage-current behavior in which, over certain voltage ranges, increasing the voltage applied across the diode leads to decreased current carried through the diode. For certain voltage ranges, however, current flows relatively freely through the diode. In contrast, for most devices, increasing the voltage applied across the diode, within operating parameters, leads to increasing current regardless of the voltage range. Tunnel diodes, in general, have a number of applications, including high frequency oscillator circuits and high frequency electronic switches.

One type of tunnel diode is the double barrier tunnel diode, which generally includes a quantum well with thin barrier layers on either side. This structure is known as a double barrier structure and typically lies between two injection layers. The double barrier structure serves as an energy barrier to the flow of electrons that can be overcome only under certain conditions. Fulfillment of these conditions results in a negative differential resistance characteristic of interest over a range of external applied bias voltages. Electrons are injected into the double barrier structure from the conduction band of one of the injection layers under an internal electric field produced by the applied external bias voltage. The applied voltage increases the energy of the injected electrons such that they satisfy the resonant tunneling condition of the quantum barrier. Under such voltage conditions, the resonance condition is satisfied and an incoming electron has the same energy as an energy state of the quantum well. This condition enables electrons to tunnel through double barrier structure. As the bias voltage is increased further, the energy levels no longer match the energy state of the quantum well and the resonance condition is no longer satisfied. At this point the current decreases, resulting in the negative differential resistance effect.

Of particular interest are quantum well devices having current voltage characteristics including multiple negative differential resistance regions. Using traditional methods to achieve multiple negative differential resistance regions required complex circuitry. Therefore, development of a simpler, integrated circuit exhibiting multiple negative resistance regions was desirable. Such multiple regions may be obtained from a plurality of resonant states of a quantum well or from stacking several quantum wells together. However, the resulting devices typically require much higher voltages corresponding to excited states as compared to the resonant voltage of a single quantum well.

As a solution to this problem, and in furtherance of the continuing trend towards miniaturization and increased functional density in electronic devices, much attention has been directed toward resonant-tunneling devices as characterized by operation involving a particular carrier energy coinciding with a particular quantized energy level in a potential well. Extensive literature has been developed surrounding both the theoretical and practical device aspects as surveyed, e.g., by F. Capasso et al., "Resonant Tunneling Through Phenomena . . . in Superlattices, and Their Device Applications", IEEE *Journal of Quantum Electronics*, Vol. QE-22 (1986), pp. 1853–1869.

Also, noting that resonant-tunneling devices may be made as diodes and as transistors; see, e.g., E. R. Brown et al., "Millimeter-band Oscillations Based on Resonant Tunneling in a Double-barrier Diode at Room Temperature", *Applied Physics Letters*, Vol. 50 (1987), pp. 83–85;

H. Toyoshima et al., "New Resonant Tunneling Diode with a Deep Quantum Well", *Japanese Journal of Applied Physics*, Vol. 25 (1986), pp. L786–788;

H. Morkoc et al., "Observation of a Negative Differential Resistance Due to Tunneling through a Single Barrier into a Quantum Well", *Applied Physics Letters*, Vol. 49 (1986), pp. 70–72;

F. Capasso et al., "Resonant Tunneling Transistor with Quantum Well Base and High-energy Injection: A New Negative Differential Resistance Device", *Journal of Applied Physics*, Vol. 58 (1985), pp. 1366–1368;

N. Yokoyama et al., "A new Functional, Resonant-Tunneling Hot Electron Transistor (RHET)", *Japanese Journal of Applied Physics*, Vol. 24 (1985), pp. L853–L854;

F. Capasso et al., "Quantum-well Resonant Tunneling Bipolar Transistor Operating at Room Temperature", IEEE *Electron Device Letters*, Vol. EDL-7 (1986), pp. 573–575;

T. Futatsugi et al., "A Resonant-Tunneling Bipolar Transistor (RBT): A Proposal and Demonstration for New Functional Devices with High Current Gains", *Technical Digest of the* 1986 *International Electron Devices Meeting*, pp. 286–289;

T. K. Woodward et al., "Experimental Realization of a Resonant Tunneling Transistor", *Applied Physics Letters*, Vol. 50 (1987), pp. 451–453;

B. Vinter et al., "Tunneling Transfer Field-effect Transistor: A Negative Transconductance Device", *Applied Physics Letters*, Vol. 50 (1987), pp. 410–412;

A. R. Bonnefoi et al., "Inverted Base-collector Tunnel Transistors", *Applied Physics Letters*, Vol. 47 (1985), pp. 888–890;

S. Luryi et al., "Resonant Tunneling of Two-dimensional Electrons through a Quantum Wire: A Negative Transconductance Device", *Applied Physics Letters*, Vol. 47 (1985), pp. 1347–1693; and S. Luryi et al., "Charge Injection Transistor Based on Real-Space Hot-Electron Transfer", IEEE *Transactions on Electron Devices*, Vol. ED-31 (1984), pp. 832–839.

Of particular interest are integrated devices having asymmetric current-voltage characteristics and multistable states. An example of previous methods for obtaining multiple stable solutions by putting two resonant-tunneling diodes in parallel is that of Capasso et al., U.S. Pat. No. 4,902,912 in which the two resonant-tunneling diodes are separated by a resistance consisting of a low doped region between the resonant-tunneling diodes. Although the current out of the contact exhibits double peaks and multiple stable states for certain voltage differences, the required use of multiple voltage sources increases the complexity of the device. Additionally, the device is not easily adjustable or controllable. An attempt to improve on the concept developed by Capasso et al. was made by J. Soderstrom and T. Anderson, as discussed in Electron Device Letters, Vol. 9, No. 5, May 1988. Soderstrom and Anderson introduced two resistors in series with the resonant-tunneling diodes. By choosing the resistors properly, they caused the circuit to produce a double peak curve. However, this concept has the disadvantage that the resistors introduce hysteresis, which causes the presence of different peak voltages for forward and backward voltage sweeps, and also decreases the speed of the device due to the RC time constant.

Accordingly, it is an object of the present invention to provide an integrated circuit including an oppositely connected resonant tunneling diode pair with an asymmetric current-voltage characteristic which exhibits multistable states and can be tailored for multistable solutions. It is another object of the present invention to provide apparatus in accordance with the invention, which provide examples of its best-mode usage.

SUMMARY OF THE PRESENT INVENTION

In accordance with the present invention, an integrated asymmetric resonant tunneling diode pair circuit and apparatus incorporating it therein are presented. The integrated resonant tunneling diode pair circuit is composed of a substrate with multiple layers of doped and undoped materials and electrical contact materials deposited thereon. By providing an integrated diode pair with asymmetric characteristics deposited on a single substrate, the present invention affords the benefit of a simple, integrated design which greatly reduces circuit complexity and size. The present invention provides current-voltage characteristics which exhibit multistable states, and which may be tailored for multistable solutions as well as apparatus in which the circuit is incorporated. The integrated asymmetric resonant tunneling diode pair circuit presented herein is useful in all applications which utilize multiple peak characteristics of the current-voltage curve, such as multiple-valued logic analog-to-digital quantizers, frequency multiplication devices, waveform scrambling devices, memory operations, and parity-bit generation, among others.

BRIEF DESCRIPTION OF THE DRAWINGS

FIG. 2 provides a tabular description of the preferred materials and layer configuration for the present invention along with the thickness range, preferred thickness, doping level range, and preferred doping level, where applicable, for the preferred material structure.

FIG. 5 presents, for comparison, energy band edge diagrams with zero applied bias for both a typical symmetric resonant tunneling diode and for the asymmetric resonant tunneling diode of the present invention;

DETAILED DESCRIPTION

The present invention relates to the fabrication of an integrated asymmetric resonant tunneling diode pair circuit and apparatus incorporating it therein. The following description is presented to enable one of ordinary skill in the art to make and use the invention and to incorporate it in the context of particular applications. Various modifications to the preferred embodiment, as well as a variety of uses in different applications will be readily apparent to those skilled in the art, and the general principles defined herein may be applied to other embodiments. Thus, the present invention is not intended to be limited to the embodiments shown, but is to be accorded the widest scope consistent with the principles and novel features disclosed herein.

Figure 1:
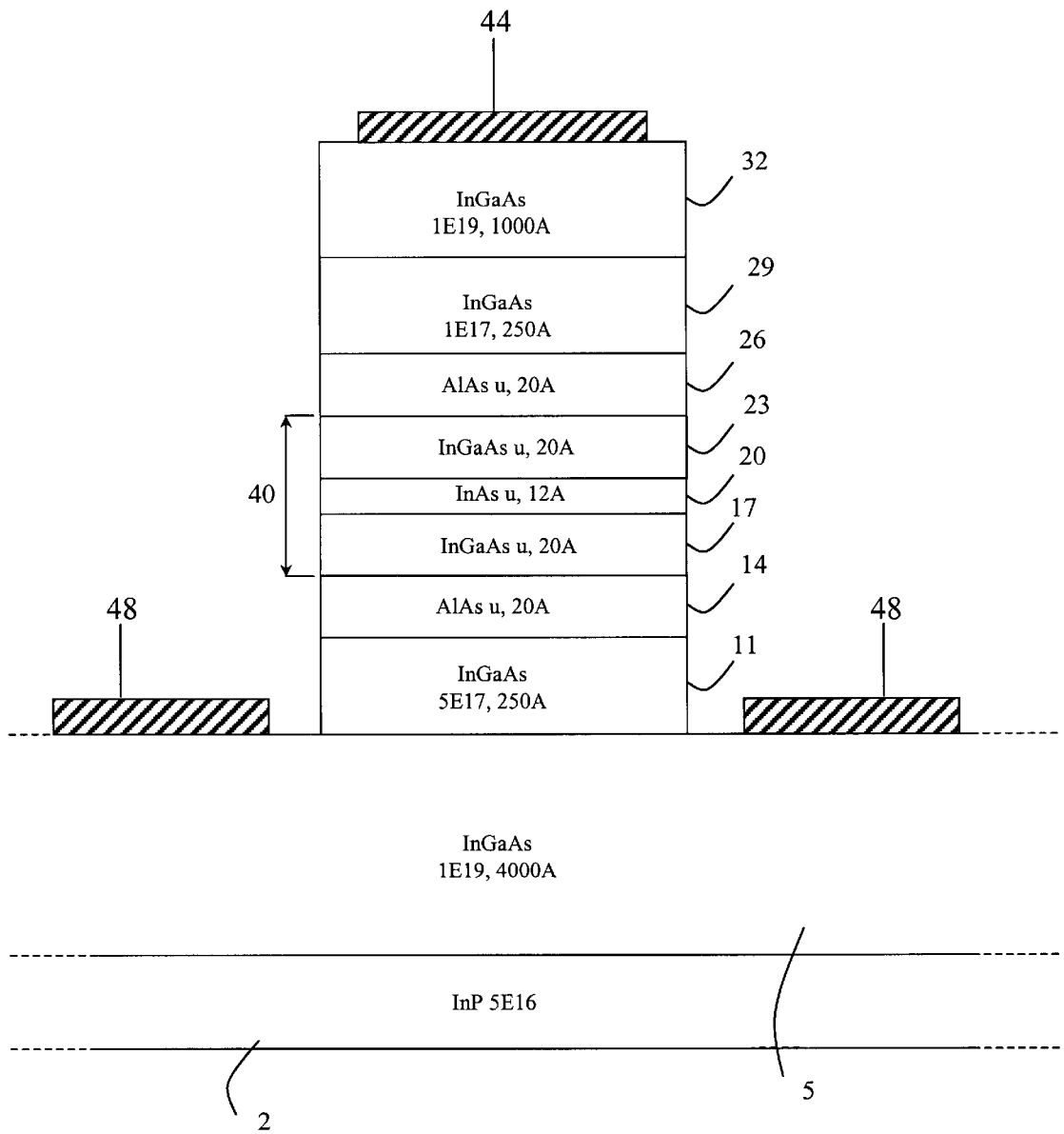
FIG. 1 is a schematic cross-sectional representation of a preferred embodiment of the invention utilizing the preferred material family.

The preferred embodiment of the integrated asymmetric resonant tunneling diode pair is shown in FIG. 1, and may be fabricated by a number of standard manufacturing processes, including but not limited to, molecular beam epitaxy, metal organic vapor phase epitaxy, gas source epitaxy, metal organic molecular beam epitaxy, and chemical beam epitaxy. Also, although the preferred embodiment described herein utilizes an InGaAs/AlAs/InAs structure, material structures such as GaAs/AlGaAs/AlAs, InAs/AlSb/InAs, or InAs/AlSb/GaSb, among others, may be substituted with substantially the same effect. In addition, although InP was used as the substrate, other semi-insulating substrate materials may also be used. These other material structures may be chosen based on a particular application and their elements may be combined as hybrid structures. Furthermore, although both a preferred thickness range and a preferred doping range have been provided, it is foreseen that values outside of these ranges may be beneficial, depending on the particular application.

In the preferred embodiment, the fabrication process begins with an indium phosphide substrate 2, acting as a semi-insulating material, doped with approximately $5 \times 10^{16}$/cm$^3$ of iron, onto which an indium gallium arsenide injection layer 5 is epitaxially deposited and n-doped to roughly between $1 \times 10^{18}$/cm$^3$ and $1 \times 10^{19}$/cm$^3$ silicon, preferably $1 \times 10^{19}$/cm$^3$, and which has a thickness in the range of 1,000 to 10,000 angstroms, preferably 4,000 angstroms. Further deposited layers include a lightly doped indium gallium arsenide spacer layer 11 n-doped with roughly between $3 \times 10^{17}$/cm$^3$ and $1 \times 10^{18}$/cm$^3$ silicon, preferably $5 \times 10^{17}$, and having a thickness in the range of 100 to 500 angstroms, preferably 250 angstroms. Next, an undoped barrier layer 14 of aluminum arsenide is deposited, having a thickness ranging from 10 to 30 angstroms, preferably 20 angstroms, followed by layers 17, 20, and 23, which form a resonant-tunneling quantum-well 40. Although the quantum-well is demonstrated as having three layers here, it may include any number of layers suitable to the particular application. Layers 17 and 23 are nominally undoped indium gallium arsenide layers having thicknesses ranging from 10 to 40 angstroms, preferably 20 angstroms. The central quantum-well layer 20 is an indium arsenide layer with a thickness ranging from 10 to 25 angstroms, preferably 12 angstroms. Note that barrier and quantum-well layers may have homogeneous or heterogeneous compositions, e.g., in the case of linearly graded barrier layers or a parabolically graded well layer. Typically, the bandgaps of the material of the quantum-well layers 17, 20, 23 is less than the bandgap of the material of the barrier layers 14, 26. Onto layer 23 of the resonant-tunneling quantum-well 40, an undoped barrier layer 26 of aluminum arsenide is deposited with a thickness ranging from 10 to 30 angstroms, preferably 20 angstroms. Next, a lightly doped indium gallium arsenide spacer layer 29 is deposited, n-doped with between $5 \times 10^{15}/cm^3$ and $2 \times 10^{17}/cm^3$ silicon, preferably $1 \times 10^{17}/cm^3$, and having a thickness in the range of 100 to 500 angstroms, preferably 250 angstroms. Next deposited is another indium gallium arsenide injection layer 32, n-doped with between $1 \times 10^{18}/cm^3$ and $1 \times 10^{19}/cm^3$ silicon, preferably $1 \times 10^{19}/cm^3$, and having a thickness in the range of 300 to 3000 angstroms, preferably 1000 angstroms. After deposition of indium gallium arsenide layer 32, a conductive material, e.g. gold is evaporated or otherwise added to form contact pad 44. Additionally, layers 32, 29, 26, 23, 20, 17, 14, 11, and 5 are etched by a wet chemical process, or by another equivalent process, to expose the indium gallium arsenide layer 5, the exposed area having a conductive material such as gold or other conductive material evaporated or otherwise added thereon to form contact pad 48. In FIG. 1, contact pad 48 is demonstrated as a cross-sectional view of a ring formed around the mesa of layers under contact pad 44. The contact pads may vary dimensionally depending on the particular application. The preferred thicknesses and doping level ranges for the layers discussed in this paragraph as well as those of the substrate have been summarized in FIG. 2 for easy reference.

In the preferred embodiment of FIG. 1, the indium gallium arsenide layers 5, 11, 17, 23, 29, and 32 have an $In_xGa_{1-x}As$ concentration of preferably =0.532, which produces a lattice match with the InP substrate, but this figure may range between 0.45 and 0.60.

In order to vary the symmetry of the asymmetric resonant-tunneling diode pair circuit, adjustments may be made to the various layers both in thickness and in doping levels, or by the addition of layers. These adjustments need not be made independently. Depending on the situational needs and the specific properties desired, adjustments may be made via a combination of changes to the thicknesses, doping levels, and by the addition of layers. As is readily apparent, many structural combinations are possible, giving the flexibility to tailor the device to the specific needs of a variety of applications.

Additional undoped spacer layers may be used not only to adjust the symmetrical properties of the circuit, but also to provide further protection to the resonant-tunneling quantum-well in order to maintain its integrity and to prevent scattering of the electrons by the dopants. For demonstration in the case of FIG. 1, using the preferable material of InGaAs, each of the additional layers would have thicknesses ranging from 10 to 100 angstroms and would be introduced between n-doped indium gallium arsenide spacer layer 11 and aluminum arsenide barrier layer 14 and between aluminum arsenide barrier layer 26 and n-doped indium gallium arsenide spacer layer 29. Although these layers, for purposes of demonstration, would be fabricated of InGaAs, they may be composed of any suitable material and thickness useful with the particular material family chosen for the device.

While standard molecular-beam epitaxy is considered well suited for device fabrication, use of other methods is not precluded. Examples of a few other manufacturing techniques that are sufficiently suitable include metal organic vapor phase epitaxy, gas source epitaxy, metal organic molecular beam epitaxy, chemical beam epitaxy, liquidphase epitaxy, and atomic-layer epitaxy. While these methods are sufficient to make the device of this invention, it is contemplated that other suitable manufacturing techniques may be used and that others may become available in the future.

Figure 3:
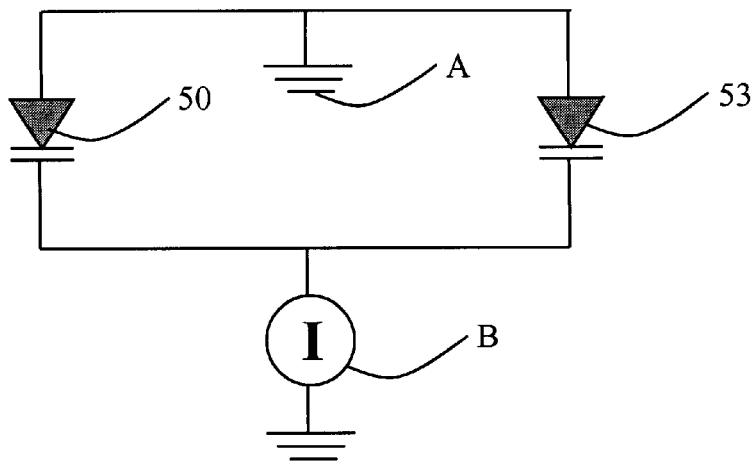
FIG. 3 is a diagram of a circuit, which is operationally equivalent to the device shown in FIG. 1.

With reference to FIG. 3 and FIG. 1, a single device structure as shown in FIG. 1 can be utilized as the equivalent of two asymmetrically configured resonant-tunneling diodes 50 and 53 in parallel as shown in FIG. 3. The device of FIG. 1 exhibits an asymmetric current-voltage characteristic due to the structural asymmetry of lightly doped spacer layers 29 and 11. As mentioned, this structural asymmetry may be brought about by a number of methods such as variations in thickness, materials used, and doping levels. In practice, two diodes as depicted in FIG. 1 may be formed on a single substrate corresponding to the two diodes 50 and 53 of the structure of FIG. 3, such that contact pads 44 and 48 of the first diode correspond to the ground connection A and the current source B of FIG. 3, respectively, and such that contact pads 44 and 48 of the second diode correspond to the current source B and the ground connection A of FIG. 3, respectively. Thus, the two diodes would be connected oppositely so that the asymmetric properties of the diodes may be effectively utilized. Both diodes would be formed on a single substrate and would have identical structure but would be contacted oppositely, thus utilizing a single structure for two different current-voltage characteristics by connecting it oppositely in the circuit.

During device operation, current flows between contact pads 44 and 48, and depending on the direction and bias history, different stable states will be exhibited by the circuit. As previously stated, varying symmetries may be achieved depending on the chosen number of layers as well as the layer thickness and doping levels. As such, the device provides an integrated circuit with asymmetric characteristics, as opposed to a traditional system requiring two distinct diode structures to generate the same effect. While it is possible to implement the circuit of FIG. 3 using discrete resonant-tunneling diodes 50 and 53, a monolithically integrated device as shown in FIG. 1 has distinct advantages of reduced parasitic resistances and capacitances, as well as better reproducibility of its current-voltage characteristics by providing consistent doping levels to multiple resonant-tunneling diodes fabricated on a common substrate in the course of one manufacturing process. Thus, because of its unitary nature, the present invention affords simpler and more consistent production, greater functional control, and smaller size than comparable two-diode systems.

Figure 4:
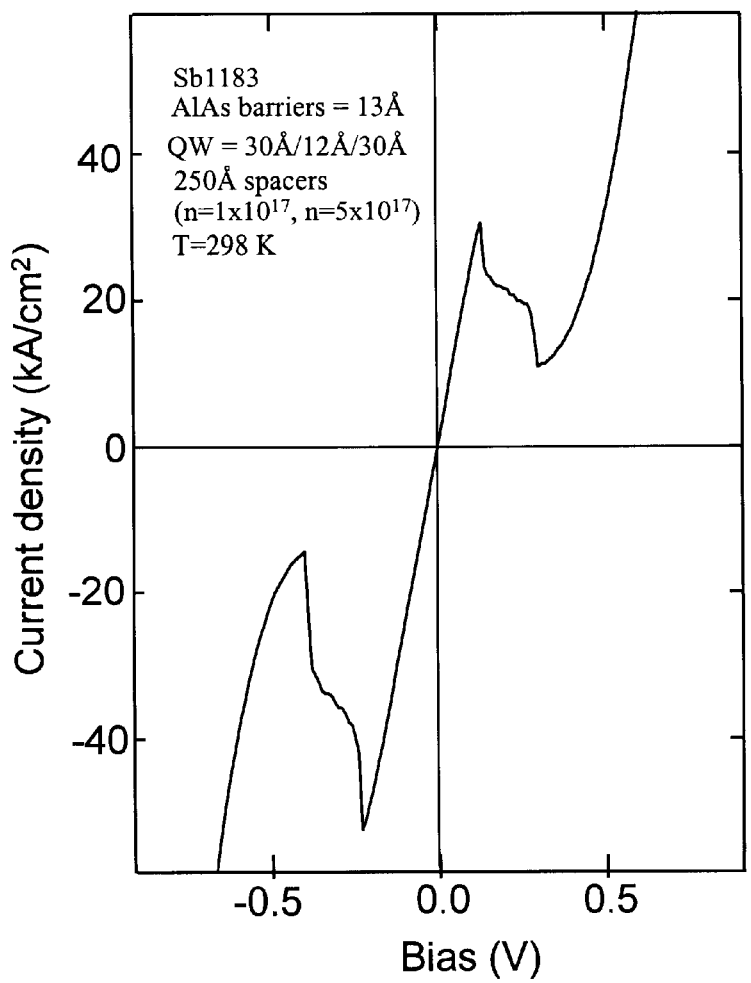
FIG. 4 is an example of a recorded current-voltage diagram as obtained by operating a device as shown in FIG. 1.

For different values of the potential difference $V_{44,\ 48}$ between contact pads 44 and 48 of FIG. 1, the current through contact pad 44 of a device as described above was measured as a function of both positive and negative biases applied between contact pad 44 and grounded contact pad 48. FIG. 4 is a measured graph of current density for varying positive and negative applied bias values. The relevant statistics for the embodiment used in the generation of the graph are also included in the figure. Note that while the characteristics of FIG. 4 were obtained at room temperature, the operating range of the present invention is approximately from 4 K to 473 K. As is apparent upon inspection of the graph in FIG. 4, the positive and negative density peaks, as absolute values, are asymmetric with respect to the absolute value of the applied bias voltage. As described previously the asymmetric properties of the circuit may be altered by varying the doping level, varying the layer thickness, varying the material combination used, by adding new layers, or by combining any of these methods. As the absolute value of the bias increases toward the resonance energy levels, i.e. the peaks of the curve, the current flowing through the circuit increases sharply. When the absolute value of the bias exceeds the resonance energy level, there is a sharp decline in the current passing through the circuit. This negative conductance is caused by the quenching effect that occurs for biases above the resonance energy level. This decline continues until the absolute value of the bias begins to approach the breakdown region where the current increases dramatically with a small increase in the applied bias.

For comparison, in FIG. 5 energy band edge diagrams with zero applied bias are shown both for a typical symmetric resonant tunneling diode and for the asymmetric resonant tunneling diode of the present invention. The materials shown in the comparison are the same as those in the layers of FIG. 1. In this particular case, changes in the doping level were used to cause asymmetry. Again, although not shown in the figure, different layer thicknesses, the addition of layers, and the use of different materials may be utilized to change the symmetry. The effects of these device changes on the energy conduction diagrams of the figure would be easily understood to one skilled in the art.

Figure 6:
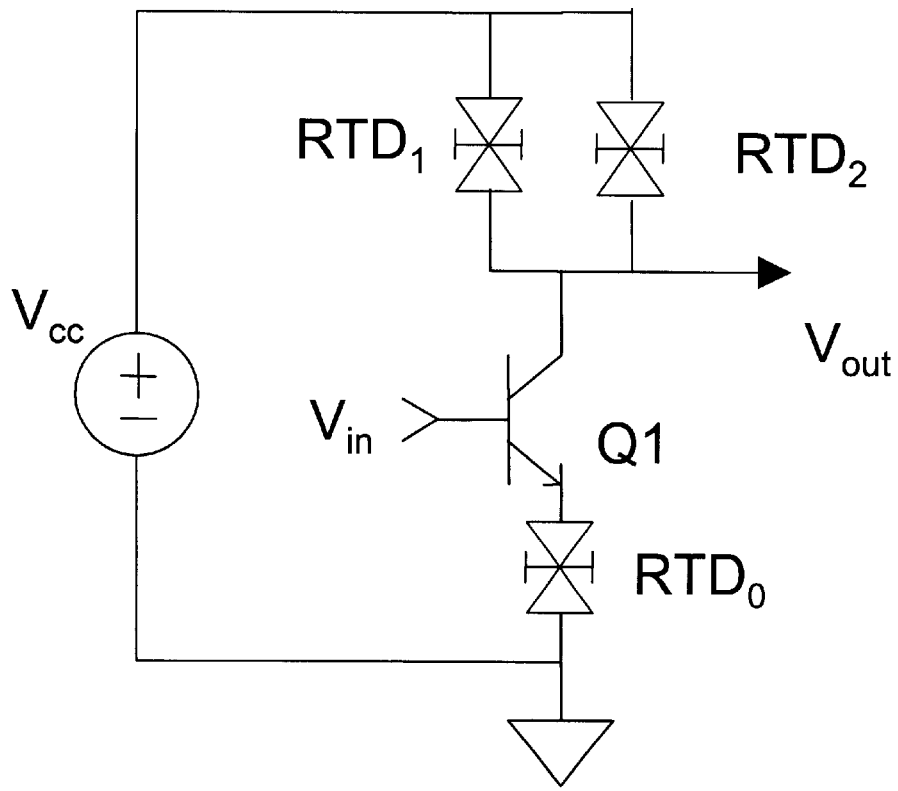
FIG. 6 provides an example of the present invention, along with appropriate circuitry to provide a multiple-valued logic analog-to-digital quantizer.
Figure 7:
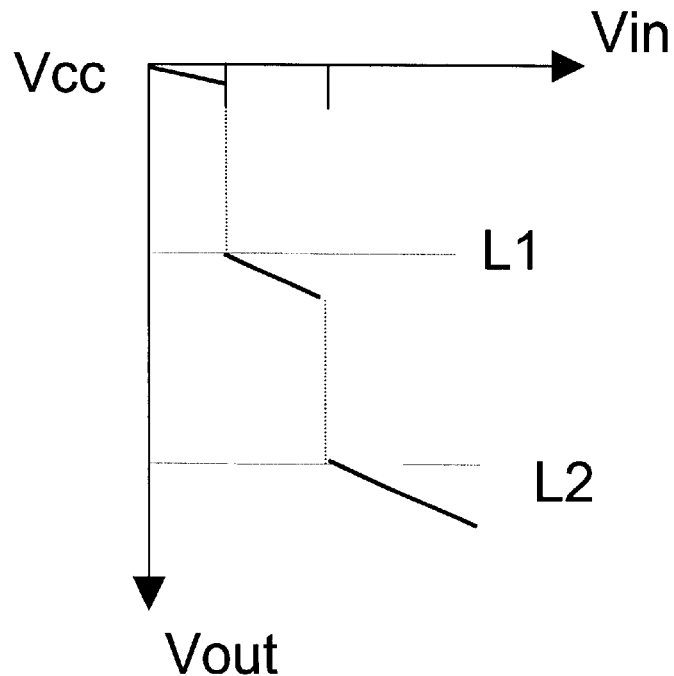
FIG. 7 provides a demonstration of the operation of the device of FIG. 6 by showing the voltage-input versus voltage-output values for a range of voltage inputs.

The device of this invention can be used with suitably designed circuitry in all applications utilizing multiple peak characteristics of the current-voltage curve. Examples of these applications include multiple-valued logic analog-to-digital quantizers, frequency multiplication devices, waveform scrambling devices, memory operations, and parity-bit generation, among others. FIG. 6 provides an example of the present invention, along with appropriate circuitry to provide a multiple-valued logic analog-to-digital quantizer, an essential element of an analog-to-digital converter that converts an analog signal to a sequence of digital words. These digital words are further processed by a system employing a digital signal processor. FIG. 7 demonstrates the operation of the device of FIG. 6 by displaying the voltage-input versus voltage-output values for a range of voltage inputs. The resonant tunneling diode connected to the emitter of the bipolar transistor acts as a degeneration resistor. The transistor converts the input signal at the base to a collector current that drives the integrated asymmetric resonant tunneling diode of the present invention. Due to the self-latching action of the present invention, the voltage at the collector of the transistor is a well-defined multiple-valued logic level that corresponds to the input signal level.

What is claimed is:

1. An integrated asymmetric resonant tunneling diode pair including:

a. a quantum well having a first side and a second side and including at least one layer of a semiconductor material;

b. a pair of barrier layers including a first barrier layer member and a second barrier layer member, the first barrier layer member formed on the first side of the quantum well and the second barrier layer member formed on the second side of the quantum well, the first barrier layer member and the second barrier layer member formed of an independently selectable alloy having an independently adjustable thickness, the thickness being sufficiently small to permit electrons to tunnel through the barrier layers to the quantum well;

c. one or more pairs of electron injection layers each including a first injection layer member and a second injection layer member, said first injection layer member formed such that the first barrier layer member is between the first injection layer member and the quantum well, said second injection layer member formed such that the second barrier layer member is between the second injection layer member and the quantum well, each injection layer member formed of an independently selectable alloy having an independently adjustable thickness and an independently adjustable doping level;

d. said alloy, thickness, and doping level of the injection layer members and said alloy and thickness of the barrier layers being selected such that when a first terminal is connected to the electron injection layer members on the first side of the quantum well and a second terminal is connected to the electron injection layer members on the second side of the quantum well, a desired asymmetric current-voltage characteristic having multistable states is exhibited for oppositely applied biases of equal absolute value.

2. An integrated asymmetric resonant tunneling diode circuit as set forth in claim 1 wherein the desired asymmetric current-voltage characteristic is caused exclusively by variations of the injection layer member alloy, thickness, and doping level.

3. An integrated asymmetric resonant tunneling diode circuit as set forth in claim 1 wherein the desired asymmetric current-voltage characteristic is caused exclusively by variations of the barrier layer member alloy and thickness.

4. An integrated asymmetric resonant tunneling diode circuit as set forth in claim 1 formed of a material family selected from the group consisting of InGaAs/AlAs/InAs, GaAs/AlGaAs/AlAs, InAs/AlSb/InAs, and InAs/AlSb/GaSb.

5. A plurality of integrated asymmetric resonant tunneling diode circuits as set forth in claim 1, each formed as a unitary and electrically independent mesa structure.

6. An integrated asymmetric resonant tunneling diode circuit as set forth in claim 1, further including at least one spacer layer on either side of the quantum well between the injection layers and the barrier layers, each of the spacer layers formed of an independently selectable alloy having an independently adjustable thickness and an independently adjustable doping level which may be chosen such that when a first terminal is connected to the electron injection layers on the first side of the quantum well and a second terminal is connected to the electron injection layers on the second side of the quantum well, a desired asymmetric current-voltage characteristic having multistable states is exhibited for oppositely applied biases of equal absolute value.

7. An integrated asymmetric resonant tunneling diode circuit as set forth in claim 6 wherein the desired asymmetric current-voltage characteristic is caused exclusively by variations of the number of spacer layers and by variations of the spacer layer alloy, thickness, and doping level.

8. An integrated asymmetric resonant tunneling diode circuit as set forth in claim 6 wherein the desired asymmetric current-voltage characteristic is caused exclusively by variations of the spacer layer doping level.

9. An integrated asymmetric resonant tunneling diode circuit as set forth in claim 6 wherein the desired asymmetric current-voltage characteristic is caused exclusively by variations of the spacer layer thickness.

10. An integrated asymmetric resonant tunneling diode circuit as set forth in claim 6 formed of a material family selected from the group consisting of InGaAs/AlAs/InAs, GaAs/AlGaAs/AlAs, InAs/AlSb/InAs, and InAs/AlSb/GaSb.

11. An integrated asymmetric resonant tunneling diode circuit as set forth in claim 6 wherein the quantum well includes a central layer with side layers formed on either side of the central layer, said central layer being composed of InAs and said side layers being composed of $In_xGa_{1-x}As$, with x from about 0.45 to 0.60.

12. An integrated asymmetric resonant tunneling diode circuit as set forth in claim 6 wherein the barrier layers are composed of AlAs.

13. An integrated asymmetric resonant tunneling diode circuit as set forth in claim 6 wherein the spacer layers are composed of $In_xGa_{1-x}As$, with x from about 0.45 to 0.60.

14. An integrated asymmetric resonant tunneling diode circuit as set forth in claim 6 wherein the injection layers are composed of $In_xGa_{1-x}As$, with x from about 0.45 to 0.60.

15. A plurality of integrated asymmetric resonant tunneling diode pairs as set forth in claim 6, each formed as a unitary and electrically independent mesa structure.

16. Apparatus of claim 6, further comprising circuitry connected to the device whereby the apparatus performs frequency multiplication.

17. Apparatus of claim 6, further comprising circuitry connected to the device whereby the apparatus performs waveform scrambling.

18. Apparatus of claim 6, further comprising circuitry connected to the device whereby the apparatus performs memory operation.

19. Apparatus of claim 6, further comprising circuitry connected to the device whereby the apparatus performs parity-bit generation.

20. Apparatus of claim 6, further comprising circuitry connected to the device whereby the apparatus performs analog-to-digital converter quantizing functions.

* * * * *